United States Patent
Lipka

(10) Patent No.: US 11,118,906 B2
(45) Date of Patent: Sep. 14, 2021

(54) OSCILLATOR CIRCUIT INCLUDING OSCILLATOR

(71) Applicant: Panasonic Intellectual Property Management Co., Ltd., Osaka (JP)

(72) Inventor: Ronald Joseph Lipka, Northborough, MA (US)

(73) Assignee: PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/369,640

(22) Filed: Mar. 29, 2019

(65) Prior Publication Data
US 2020/0309525 A1 Oct. 1, 2020

(51) Int. Cl.
G01C 19/5698 (2012.01)
H03B 5/32 (2006.01)
G01C 19/5677 (2012.01)

(52) U.S. Cl.
CPC ..... *G01C 19/5698* (2013.01); *G01C 19/5677* (2013.01); *H03B 5/326* (2013.01)

(58) Field of Classification Search
CPC ............ G01C 19/5698; G01C 19/5649; G01C 19/5607; G01C 19/5642; G01C 19/5677; H03B 5/326; H03B 5/38; H03B 5/30
See application file for complete search history.

(56) References Cited

U.S. PATENT DOCUMENTS

| | | | | |
|---|---|---|---|---|
| 4,240,047 A * | 12/1980 | Rabinowitz | ............ | G01D 5/243 331/154 |
| 4,479,098 A * | 10/1984 | Watson | ............. | G01C 19/5642 310/318 |
| 4,654,663 A * | 3/1987 | Alsenz | ............... | G01C 19/5607 310/360 |
| 4,671,112 A * | 6/1987 | Kimura | .............. | G01C 19/5607 73/504.16 |
| 5,047,734 A * | 9/1991 | Newell | ..................... | H03B 5/38 331/105 |
| 5,434,467 A * | 7/1995 | Abe | ..................... | G01C 19/5642 310/316.01 |
| 6,532,817 B1 * | 3/2003 | Yukawa | ............. | G01C 19/5607 310/329 |
| 7,370,829 B2 * | 5/2008 | Badre-Alam | ......... | B64C 27/001 180/312 |
| 7,849,745 B2 * | 12/2010 | Wang | .................... | B81B 3/0086 73/514.34 |
| 8,037,755 B2 * | 10/2011 | Nagata | .................... | G01C 19/56 73/504.04 |
| 8,166,816 B2 | 5/2012 | Ayazi et al. | | |

(Continued)

*Primary Examiner* — Helen C Kwok
(74) *Attorney, Agent, or Firm* — Westerman, Hattori, Daniels & Adrian, LLP

(57) ABSTRACT

An aspect of the present disclosure concerns an oscillator circuit including a driver circuit that includes a first amplifier and a current detector where the first amplifier produces an oscillation voltage signal, where the current detector detects an oscillation current signal and produces a drive voltage signal, and where the oscillation current signal corresponds to difference in voltage between the oscillation voltage signal and the drive voltage signal; a feedback circuit that includes a second amplifier receiving the oscillation voltage signal and the drive voltage signal, to produce a feedback voltage signal to the driver circuit; and an oscillator that oscillates at a frequency determined in accordance with the drive voltage signal.

9 Claims, 3 Drawing Sheets

(56) References Cited

U.S. PATENT DOCUMENTS

| | | | | |
|---|---|---|---|---|
| 2007/0220971 A1* | 9/2007 | Ayazi | ............... | G01C 19/5698 |
| | | | | 73/504.02 |
| 2013/0319116 A1* | 12/2013 | Johari-Galle | ...... | G01C 19/5684 |
| | | | | 73/504.13 |
| 2014/0230547 A1* | 8/2014 | El-Gamal | ......... | G01C 19/5698 |
| | | | | 73/504.12 |

* cited by examiner

OSCILLATOR CIRCUIT INCLUDING OSCILLATOR

TECHNICAL FIELD

Aspects of the present disclosure relate an oscillator circuit including an oscillator that produces a periodic, oscillating electronic signal.

BACKGROUND ART

An oscillator is an electronic circuit that generates a periodic waveform at a resonant frequency. U.S. Pat. No. 5,047,734, which is incorporated by reference herein in its entirety pursuant to 37 C.F.R. 1.57(c), (d) and (e), discloses an example of a conventional oscillator circuit that includes a buffer amplifier, a first signal line, a linear multiplier, a second signal line, and a crystal element having a first electrode and a second electrode. The buffer amplifier, the first signal line, the linear multiplier, the second signal line, and the crystal element are electrically connected in this order, and constitute an electrical loop. An oscillation signal passes around the loop. The crystal element produces and outputs the oscillation signal from the first electrode. The buffer amplifier amplifies the output oscillation signal, and provides the linear multiplier with the amplified oscillation signal. The oscillator circuit further includes an envelope detector and an automatic gain control (AGC) amplifier. The envelope detector detects the amplitude of the output oscillation signal as a detected signal at an output terminal of the buffer amplifier. The AGC amplifier applies signal gain and low-pass filtering to the detected signal to produce a control signal. The linear multiplier combines the amplified oscillation signal with the control signal to produce and feed a driving signal to the second electrode of the crystal element where the amplitude of the driving signal is maintained at a constant level.

The configuration of the above conventional oscillator circuit is applicable to a mode-matched vibratory micro-electro-mechanical systems (MEMS) gyroscope. The MEMS gyroscope functions as an angular velocity sensor when it is driven at a resonant frequency determined in accordance with the drive voltage signal. A bulk acoustic wave gyroscope is used as the MEMS gyroscope. As shown in U.S. Pat. No. 8,166,816, which is incorporated by reference herein in its entirety pursuant to 37 C.F.R. 1.57(c), (d) and (e), a bulk acoustic wave gyroscope generally requires at least one drive electrode coupled to a bulk acoustic resonator and positioned to excite vibration of the bulk acoustic resonator in a first bulk acoustic wave mode, and at least one sense electrode coupled to the bulk acoustic resonator and positioned to detect vibration of the bulk acoustic resonator in a second bulk acoustic wave mode, where the first and second bulk acoustic wave modes are degenerate.

SUMMARY

When the configuration of the above conventional oscillator circuit is applied to a MEMS gyroscope, the MEMS gyroscope requires, in addition to the at least one drive electrode and the at least one sense electrode, a monitor electrode that outputs a detected signal to be fed back to an AGC amplifier to maintain an amplitude of a driving signal at a constant level. Given that the MEMS gyroscope has limited space for electrodes, multiple electrodes including the monitor electrode would add complexity and additional error sources to the system.

In light of the above circumstance, an aspect of the present disclosure concerns an oscillator circuit comprising a driver circuit comprising a first amplifier and a current detector, the first amplifier producing an oscillation voltage signal, the current detector detecting an oscillation current signal and producing a drive voltage signal, the oscillation current signal corresponding to difference in voltage between the oscillation voltage signal and the drive voltage signal; a feedback circuit comprising a second amplifier receiving the oscillation voltage signal and the drive voltage signal, to produce a feedback voltage signal to the driver circuit; and an oscillator oscillating at a frequency determined in accordance with the drive voltage signal.

DESCRIPTION OF EMBODIMENTS

Figure 1:
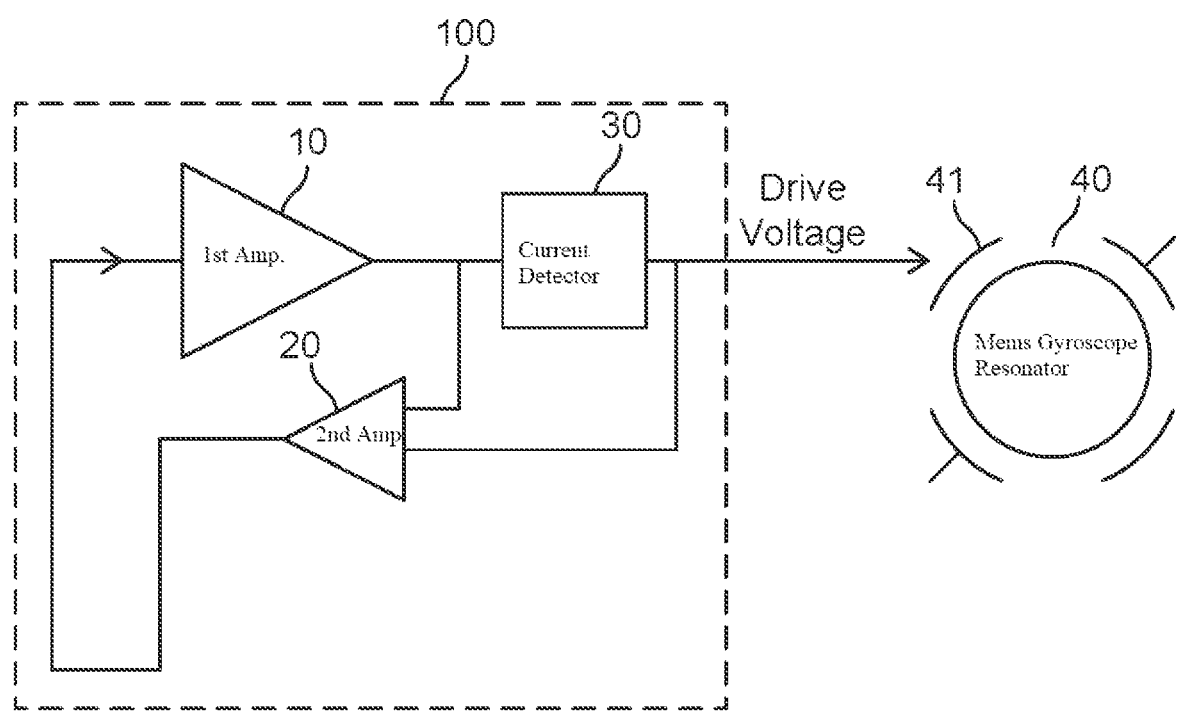
FIG. 1 shows an exemplary embodiment of an oscillator circuit 100.

FIG. 1 shows an exemplary embodiment of an oscillator circuit 100. The oscillator circuit 100 includes a first amplifier 10, a second amplifier 20, a current detector 30 and a mode-matched vibratory MEMS gyroscope resonator 40 having at least one drive electrode 41. The first amplifier 10, the second amplifier 20 and the current detector 30 may be respectively a disk driver, an AGC amplifier having two input terminals, and a current sensing resistor. The second amplifier 20 may be a standard amplifier that provides additional loop gain. The current detector 30 may be configured as a current sensing resistor. The MEMS gyroscope resonator 40 includes a bulk acoustic resonator and employs mode matching of drive and sense mechanical modes to maximize its gain (scale factor) and SNR (signal-to-noise ratio). The drive mechanical mode is electrically driven into oscillation exactly at its mechanical resonant frequency via air gap electrodes including the at least one drive electrode 41 that is coupled to the bulk acoustic resonator and positioned to excite vibration of the bulk acoustic resonator in a first bulk acoustic wave mode, and at least one sense electrode that is coupled to the bulk acoustic resonator and positioned to detect vibration of the bulk acoustic resonator (corresponding to an angular velocity of the MEMS gyroscope resonator 40) in a second bulk acoustic wave mode where the first and second bulk acoustic wave modes are degenerate.

In operation of the oscillator circuit 100, a drive voltage signal at the at least one drive electrode induces a mechanical force in the MEMS gyroscope resonator 40. If the MEMS gyroscope resonator 40 undergoes rotation about its sensing axis, some of the drive mode mechanical energy is transferred to the second mechanical mode (sense mode). This energy is proportional to the rotation rate, and causes a movement in the air gap between the bulk acoustic resonator and the at least one sense electrode. This air gap movement induces an electrical current that is amplified by a sense TIA (transimpedance amplifier) (not shown in FIG. 1) and then transmitted for determining a change in position of a device that contains the oscillator circuit 100.

The drive voltage signal at the at least one drive electrode 41 is produced as follows. The first amplifier 10 produces an oscillation voltage signal. The current detector 30 receives the oscillation voltage signal to produce a drive voltage signal. The MEMS gyroscope resonator 40 receives the drive voltage signal at the at least one drive electrode 41. The second amplifier 20 receives the oscillation voltage signal and the drive voltage signal to produce a feedback voltage signal corresponding to difference between the oscillation voltage and the drive voltage. Namely, a voltage signal across the current detector 30 is used to detect a drive current that is fed back to form the oscillation loop. This configuration enables the oscillator circuit 100 to dispense with a monitor electrode that outputs a detected signal to be fed back to the second amplifier 20 to maintain an amplitude of a driving signal at a constant level.

It is noted that the second amplifier 20 may be removed from the configuration depicted in FIG. 1.

Figure 2:
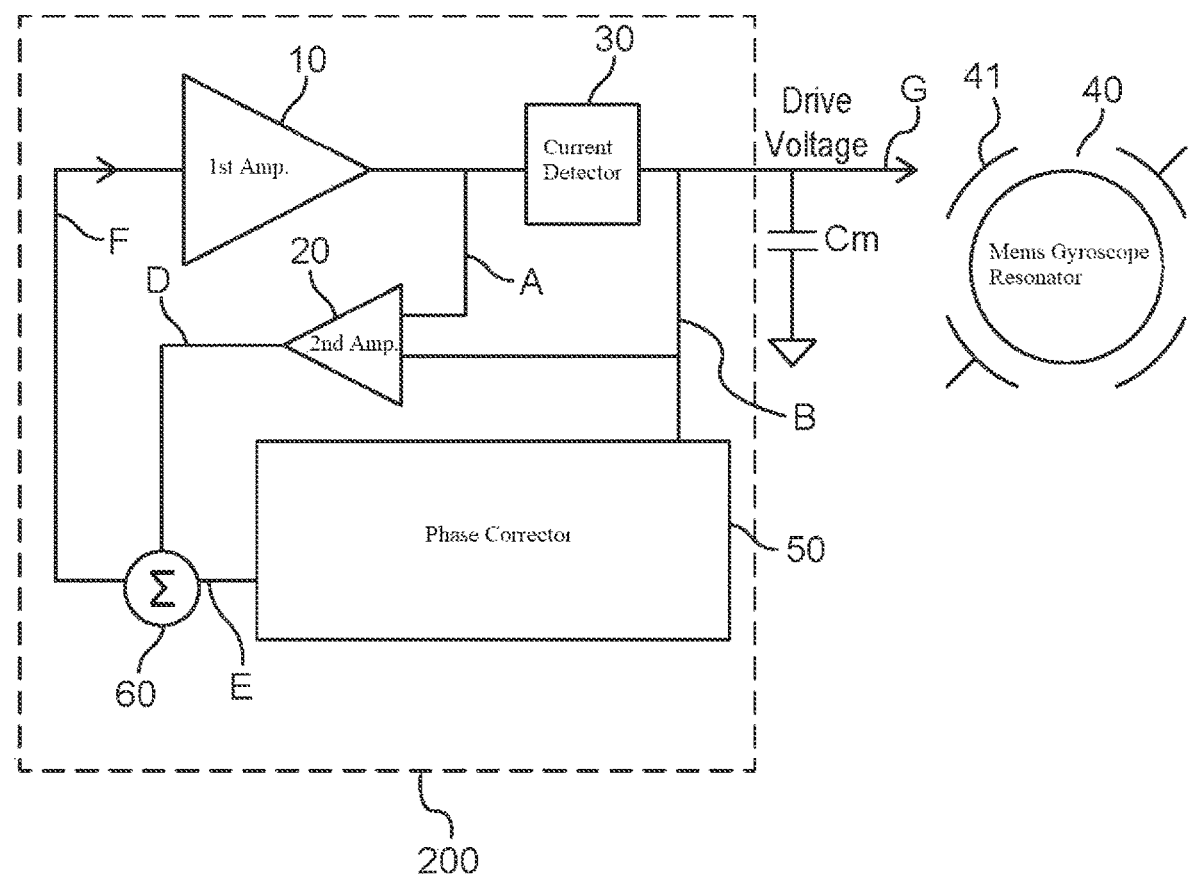
FIG. 2 shows an exemplary embodiment of an oscillator circuit 200.

FIG. 2 shows an exemplary embodiment of an oscillator circuit 200. The oscillator circuit 200 includes a phase corrector 50 and a summer 60 as well as the electrical elements included in the oscillator circuit 100.

Figure 3:
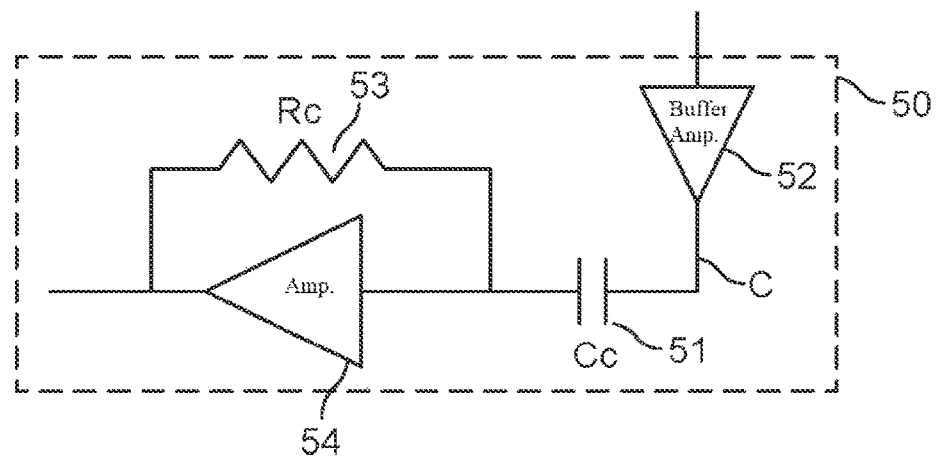
FIG. 3 shows a circuit diagram of a phase corrector 50 that consists of a capacitor 51, a buffer amplifier 52, a resistor 53 and an amplifier 54

FIG. 3 shows a circuit diagram of the phase corrector 50 that consists of a capacitor 51, a buffer amplifier 52, a resistor 53 and an amplifier 54. The phase corrector 50 in this exemplary embodiment consists of a capacitor 51, a buffer amplifier 52, a feedback resistor 53, and an amplifier 54 that forms a feedback loop with the feedback resistor 53. The capacitor 51 is connected to the amplifier 54 in series, and receives an output signal from the buffer amplifier 52. Specific parameters of the phase corrector 50 is determined such that a phase shift of the drive voltage signal caused due to parasitic capacitance Cm of the MEMS gyroscope resonator 40 is compensated.

In operation of the oscillator circuit 200, in addition to the operation of the oscillator circuit 100, phase corrector 50 receives the drive voltage signal to produce a correction voltage signal that compensates the phase shift. The summer 60 adds the correction voltage signal with the signal corresponding to difference between the oscillation voltage signal and the drive voltage signal to produce a phase corrected signal that is provided to the first amplifier.

Figure 4:
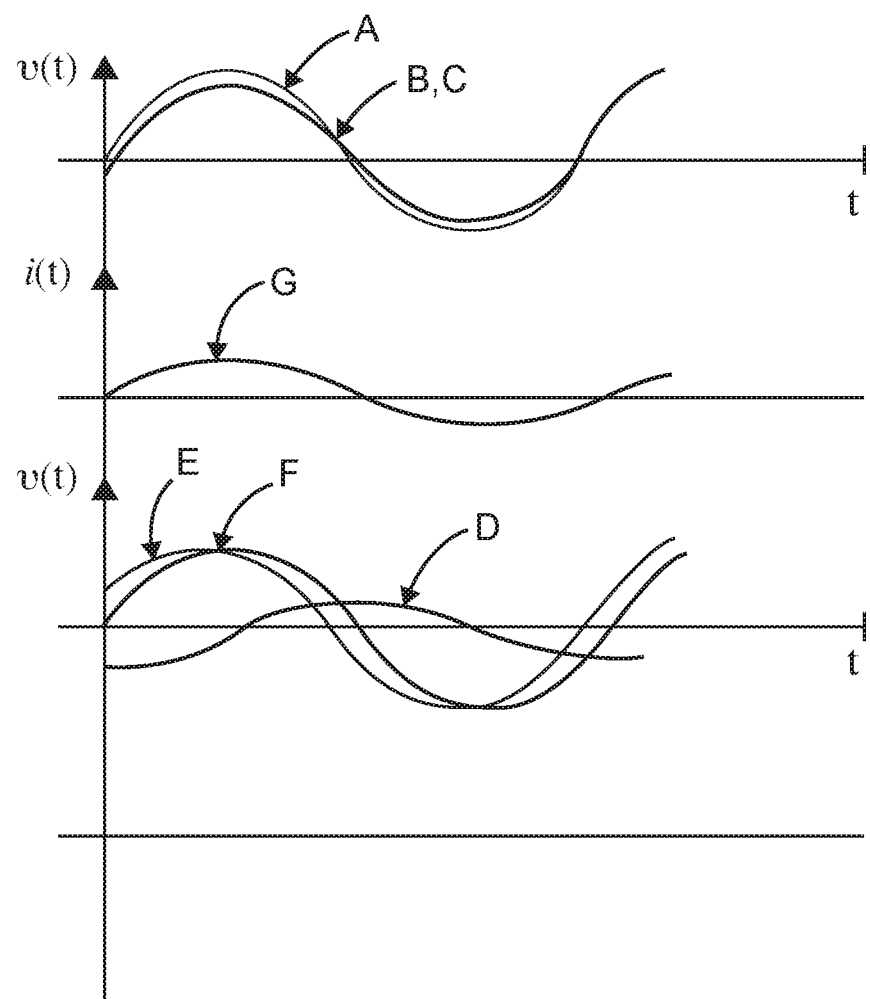
FIG. 4 illustrates graphs showing relationship between amplitude and time, associated with the operation of the oscillator circuit 200.

FIG. 4 illustrates graphs showing relationship between amplitude and time, associated with the operation of the oscillator circuit 200 where v(t) and i(t) respectively denote voltage signal and current signal at certain points shown in FIG. 2 and FIG. 3 with the oscillator circuit 200.

In FIG. 4, there is very small amplitude decrease and very small phase shift from the oscillation voltage signal at point A to the driving voltage signal at point B. This is due to the current detector 33 being a small current sensing resistor in this embodiment. The drive voltage signal at point C is the same as the drive voltage signal at B. This is due to the buffer amplifier 53 interposed therebetween. The signal corresponding to difference between the oscillation voltage signal and the drive voltage signal at point D has the phase shift. The correction voltage signal at point E is a voltage signal used to correct the phase shift by current flowing through the parasitic capacitance Cm. The summed signal at point F drives amplifier 10 to generate the oscillation voltage. Thus, the phase shift of the drive voltage signal caused due to the parasitic capacitance Cm of the MEMS gyroscope resonator 40 is compensated by the configuration adopted by the oscillator circuit 200.

As an exemplary variation, a capacitor that has the same temperature characteristics as the parasitic capacitance Cm may be adopted as the capacitor 51. Likewise, a resistor that has the same temperature characteristics as the parasitic capacitance Cm may be adopted as the resistor 53. As another exemplary variation, a variable resistor may be adopted as the resistor 53.

While the oscillator circuit of the present disclosure has been particularly shown and described with reference to the exemplary embodiments, it is understood by those having ordinary skill in the art that various changes in form and details may be made therein without departing from the spirit and scope of the present invention as defined by the following claims and their equivalents. It should therefore be understood that the exemplary embodiments be considered in all respects as illustrative and not restrictive, and that reference be made to the claims rather than the foregoing description to determine the scope of the present invention.

EXPLANATION OF REFERENCE SYMBOLS 01. 100 an oscillator circuit
02. 10 first amplifier
03. 20 second amplifier
04. 30 current detector
05. 40 MEMS gyroscope resonator
06. 41 at least one drive electrode
07. 50 phase corrector
08. 51 capacitor
09. 52 buffer amplifier
10. 53 resistor
11. 54 amplifier
12. 60 summer
13. 200 oscillator circuit

The invention claimed is:

1. An oscillator circuit comprising:
   an oscillator comprising at least one drive electrode;
   a driver circuit comprising a first amplifier that produces an oscillation voltage signal;
   a current detector configured to detect a drive current to produce a drive voltage signal, the drive current flowing to the at least one drive electrode of the oscillator; and
   a feedback circuit comprising a second amplifier receiving the oscillation voltage signal and the drive voltage signal, to produce a feedback voltage signal to the driver circuit, the feedback voltage signal corresponding to a difference in voltage between the oscillation voltage signal and the drive voltage signal,
   wherein the oscillator is configured to oscillate at a frequency determined in accordance with the drive voltage signal.

2. The oscillator circuit according to claim 1, wherein the first amplifier is a driver amplifier.

3. The oscillator circuit according to claim 1, wherein the current detector is a current sensing resistor.

4. The oscillator circuit according to claim 1, wherein the second amplifier is an automatic gain control (AGC) amplifier.

5. The oscillator circuit according to claim 1, wherein the oscillator is a mode-matched vibratory micro-electro-mechanical systems (MEMS) gyroscope and further comprises a bulk acoustic resonator and at least one sense electrode, the at least one drive electrode being coupled to the bulk acoustic resonator and positioned to excite vibration of the bulk acoustic resonator in a first bulk acoustic wave mode, the at least one sense electrode being coupled to the bulk acoustic resonator and positioned to detect vibration of the bulk acoustic resonator in a second bulk acoustic wave mode wherein the first and second bulk acoustic wave modes are degenerate and wherein the detected vibration corresponds to an angular velocity of the MEMS gyroscope.

6. The oscillator circuit according to claim 5, wherein the MEMS gyroscope has a parasitic capacitance.

7. The oscillator circuit according to claim 6, further comprising a phase corrector receiving the drive voltage signal to produce a correction voltage signal that compensates a phase shift of the drive voltage signal from the oscillation voltage signal, the phase shift being caused at least by the parasitic capacitance, wherein the driver circuit, the feedback circuit and the phase corrector are electrically connected such that the driver circuit inputs both the feedback voltage signal and the correction voltage signal.

8. The oscillator circuit according to claim 7, further comprising a summer circuit adding the correction voltage signal with the feedback voltage signal to produce a combined feedback signal such that the driver circuit inputs the combined feedback signal.

9. An oscillator circuit comprising:
an oscillator comprising at least one drive electrode;
a driver circuit comprising a first amplifier that produces an oscillation voltage signal, the oscillation voltage signal being configured to be fed back to an input terminal of the driver circuit as a feedback voltage signal corresponding to a difference in voltage between the oscillation voltage signal and a drive voltage signal; and
a current detector configured to detect a drive current to produce the drive voltage signal, the drive current flowing to the at least one drive electrode of the oscillator,
wherein the oscillator is configured to oscillate at a frequency determined in accordance with the drive voltage signal.

* * * * *

UNITED STATES PATENT AND TRADEMARK OFFICE
CERTIFICATE OF CORRECTION

| | |
|---|---|
| PATENT NO. | : 11,118,906 B2 |
| APPLICATION NO. | : 16/369640 |
| DATED | : September 14, 2021 |
| INVENTOR(S) | : Ronald Joseph Lipka |

It is certified that error appears in the above-identified patent and that said Letters Patent is hereby corrected as shown below:

On the Title Page

Column 1, item (73) Change:
(73) Assignee: PROPERTY MANAGEMENT CO., LTD.

To be:
(73) Assignee: PANASONIC INTELLECTUAL PROPERTY MANAGEMENT CO., LTD.

Signed and Sealed this
Twenty-fourth Day of May, 2022

Katherine Kelly Vidal
*Director of the United States Patent and Trademark Office*